（12）United States Patent
Hanzlik et al.

(10) Patent No.: US 10,418,270 B2
(45) Date of Patent: Sep. 17, 2019

(54) WAFER EDGE LIFT PIN DESIGN FOR MANUFACTURING A SEMICONDUCTOR DEVICE

(71) Applicant: TEL FSI, Inc., Chaska, MN (US)

(72) Inventors: Edward D. Hanzlik, Shorewood, MN (US); Sean Moore, Maple Grove, MN (US); Brian D. Hansen, Carver, MN (US)

(73) Assignee: TEL FSI, INC., Chaska, MN (US)

( * ) Notice: Subject to any disclaimer, the term of this patent is extended or adjusted under 35 U.S.C. 154(b) by 0 days.

(21) Appl. No.: 15/835,184

(22) Filed: Dec. 7, 2017

(65) Prior Publication Data

US 2018/0158717 A1 Jun. 7, 2018

Related U.S. Application Data

(60) Provisional application No. 62/431,175, filed on Dec. 7, 2016.

(51) Int. Cl.
*H01L 21/687* (2006.01)

(52) U.S. Cl.
CPC .. *H01L 21/68742* (2013.01); *H01L 21/68728* (2013.01); *H01L 21/68735* (2013.01)

(58) Field of Classification Search
None
See application file for complete search history.

(56) References Cited

U.S. PATENT DOCUMENTS

| | | |
|---|---|---|
| 3,538,883 A | 11/1970 | Polin |
| 5,554,964 A | 9/1996 | Jansseune |
| 5,598,974 A | 2/1997 | Lewis et al. |
| 5,730,803 A | 3/1998 | Steger et al. |
| 5,961,732 A | 10/1999 | Patrin et al. |
| 5,965,047 A | 10/1999 | Blersch et al. |
| 6,146,463 A | 11/2000 | Yudovsky et al. |

(Continued)

FOREIGN PATENT DOCUMENTS

| | | |
|---|---|---|
| KR | 20110036915 A | 4/2011 |
| WO | 2010054076 A2 | 5/2010 |

OTHER PUBLICATIONS

PCT/US2017/0695166, PCT International Search Report, dated Mar. 29, 2018, 3 pgs.

(Continued)

*Primary Examiner* — Binu Thomas

(74) *Attorney, Agent, or Firm* — Kagan Binder, PLLC

(57) ABSTRACT

A wafer edge lift pin of an apparatus for manufacturing a semiconductor device is described. The wafer edge lift pin includes an offset top section containing a notch portion to support and laterally confine the wafer. The notch portion horizontally sweeps away from the wafer along a radius so that rotation adjusts lateral confinement of the wafer. A base section below the top section has a diameter greater than a diameter of the top section across the notch portion to help strengthen the pin and to allow perpendicular mounting. A bottom section has a diameter that is smaller than the diameter of the base section and provides a boss feature to mount the lift pin. The apparatus includes a process chamber where the wafer is processed, a chuck assembly on which the wafer is loaded. At least three wafer edge lift pins move the wafer up and down.

16 Claims, 4 Drawing Sheets

(56) References Cited

U.S. PATENT DOCUMENTS

| | | | |
|---|---|---|---|
| 6,168,665 B1 | 1/2001 | Sakai et al. | |
| 6,241,577 B1 | 6/2001 | Shibata | |
| 6,290,569 B1 | 9/2001 | Mizuno et al. | |
| 6,435,798 B1* | 8/2002 | Satoh | H01L 21/68742 118/728 |
| 9,564,378 B2 | 2/2017 | Rose et al. | |
| 2003/0015141 A1 | 1/2003 | Takagi | |
| 2003/0132746 A1 | 7/2003 | Cox | |
| 2003/0178145 A1 | 9/2003 | Anderson et al. | |
| 2003/0230323 A1 | 12/2003 | You et al. | |
| 2004/0004713 A1 | 1/2004 | Go et al. | |
| 2004/0005212 A1* | 1/2004 | Wu | H01L 21/68 414/757 |
| 2004/0146367 A1 | 8/2004 | Ko et al. | |
| 2004/0163670 A1 | 8/2004 | Ko et al. | |
| 2005/0031497 A1 | 2/2005 | Siebert et al. | |
| 2006/0162739 A1 | 7/2006 | Sogard | |
| 2006/0182528 A1* | 8/2006 | Fan | H01L 21/68742 414/155 |
| 2007/0209684 A1 | 9/2007 | Chen et al. | |
| 2008/0056857 A1 | 3/2008 | Hiroki | |
| 2008/0229811 A1 | 9/2008 | Zhao et al. | |
| 2008/0280453 A1 | 11/2008 | Koelmel et al. | |
| 2009/0314211 A1 | 12/2009 | Du Bois et al. | |
| 2010/0012856 A1* | 1/2010 | Aoki | H01L 21/68728 250/491.1 |
| 2011/0188974 A1 | 8/2011 | Diamond | |
| 2012/0325275 A1 | 12/2012 | Goodman et al. | |
| 2013/0152971 A1* | 6/2013 | Kato | H01L 21/68728 134/21 |
| 2014/0152976 A1 | 6/2014 | VanHoomissen et al. | |
| 2014/0166055 A1 | 6/2014 | Haung et al. | |
| 2014/0332161 A1 | 11/2014 | Ricci et al. | |
| 2015/0279708 A1* | 10/2015 | Kobayashi | H01L 21/68728 118/725 |
| 2016/0096207 A1 | 4/2016 | Butterbaugh et al. | |
| 2016/0172256 A1 | 6/2016 | Rose et al. | |
| 2017/0338131 A1 | 11/2017 | Amahisa et al. | |
| 2018/0130694 A1 | 5/2018 | Inhofer et al. | |
| 2018/0151396 A1 | 5/2018 | Hanzlik et al. | |
| 2018/0214915 A1 | 8/2018 | Butterbaugh | |

OTHER PUBLICATIONS

PCT/US2014/069557, PCT International Search Report, dated Mar. 3, 2015, 5 pgs.

PCT/US2017/063486, PCT International Search Report, dated Mar. 5, 2018, 3 pgs.

PCT/US2017060543, PCT International Search Report, dated Feb. 20, 2018, 5 pgs.

PCT/US2018/015545, PCT International Search Report, dated May 14, 2018, 4 pgs.

PCT/US2019/018405 PCT International Search Report, dated May 6, 2019, 2018, 3 pgs.

\* cited by examiner

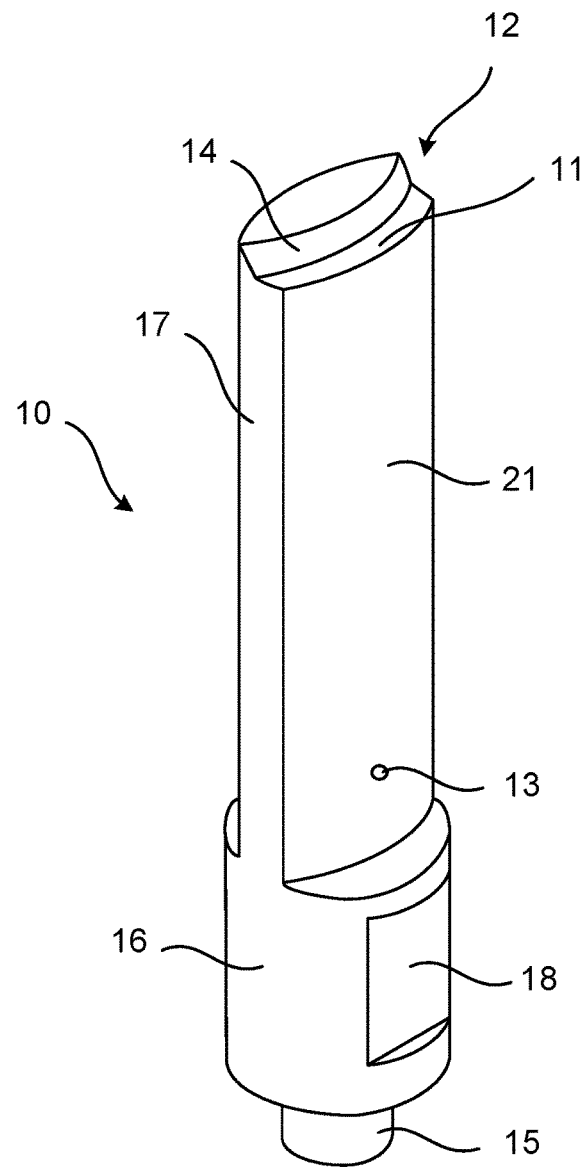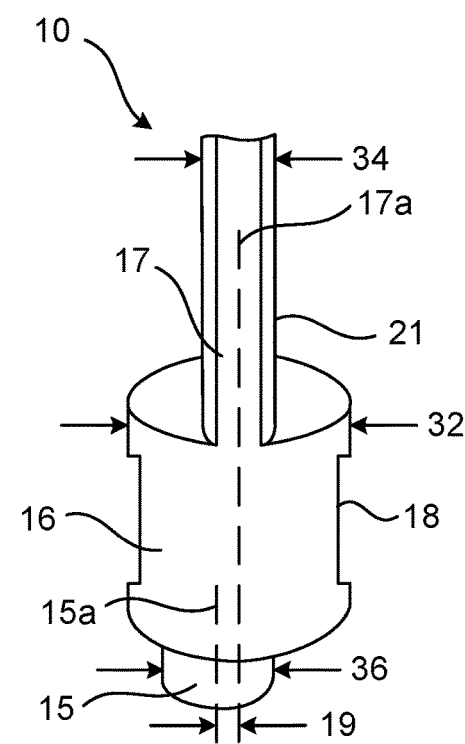
Fig.1A
Fig.1B

WAFER EDGE LIFT PIN DESIGN FOR MANUFACTURING A SEMICONDUCTOR DEVICE

CROSS-REFERENCE TO RELATED APPLICATIONS

This application is related to and claims priority to U.S. Provisional Patent Application Ser. No. 62/431,175 filed on Dec. 7, 2016, the entire contents of which are herein incorporated by reference.

FIELD OF THE INVENTION

The present invention relates to an apparatus for manufacturing a semiconductor device, and more particularly to a wafer edge lift pin that moves a wafer up and down in a process chamber.

BACKGROUND OF THE INVENTION

Wafer edge lift pins are used in the semiconductor industry to lift/lower a wafer from/to a chuck assembly to gain clearance for an end effector (e.g., a robot arm) to pick/place the wafer. A problem with edge lift pins design is the need to ensure the wafer lift mechanism does not drop the wafer, and the lateral location of the edge lift pins with respect to the edge of the wafer is critical. To ensure the wafer is not dropped, the edge lift pins are positioned to within thousandths of an inch to the edge of the chuck assembly. A tolerance analysis of the involved processing system components (i.e., lift plate, lift pins, and chuck assembly) reveals the possibility of interferences.

SUMMARY OF THE INVENTION

A wafer edge lift pin of an apparatus for manufacturing a semiconductor device is described. The wafer edge lift pin includes a top section containing a notch portion having a horizontal upwardly facing surface for supporting a wafer and a vertically sloped surface for lateral confinement of the wafer, where the notch portion is horizontally swept away from the wafer along a radius. The wafer edge lift pin further includes a base section below the top section, the base section having a diameter that is greater than a diameter of the top section across the notch portion, and a bottom section having a diameter that is smaller than the diameter of the base section.

An apparatus for manufacturing a semiconductor device using a wafer is described. The apparatus includes a process chamber where the wafer is processed, a chuck assembly on which the wafer is loaded, and a plurality of at least three wafer edge lift pins for moving the wafer up and down. Each of the plurality of at least three wafer edge lift pins includes a top section containing a notch portion having a horizontal upwardly facing surface for supporting a wafer and a vertically sloped surface for lateral confinement of the wafer, where the notch portion is horizontally swept away from the wafer along a radius, a base section below the top section, the base section having a diameter that is greater than a diameter of the top section across the notch portion, and a bottom section having a horizontal diameter that is smaller than the diameter of the base section.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1A shows an elevated side view of a wafer edge lift pin according to an embodiment of the invention;

FIG. 1B shows another elevated side view of a wafer edge lift pin according to an embodiment of the invention;

DETAILED DESCRIPTION OF SEVERAL EMBODIMENTS

Figure 2:
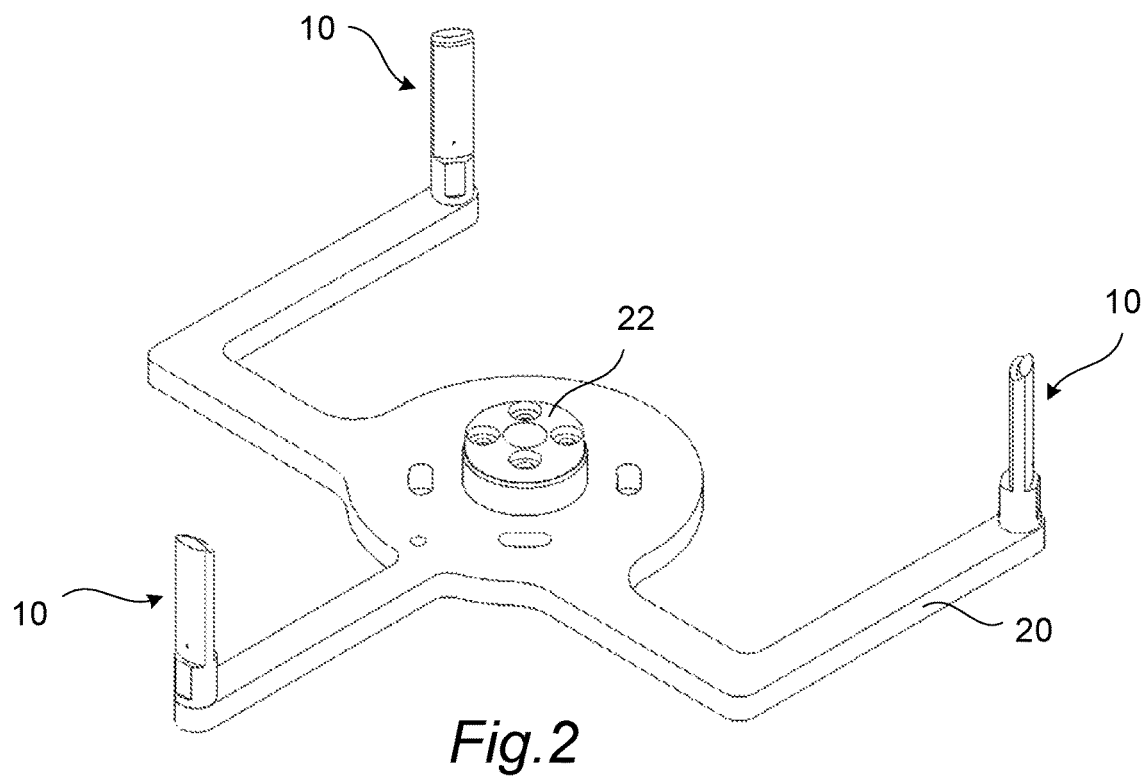
FIG. 2 shows a lift plate and wafer edge lift pins according to an embodiment of the invention.

One embodiment of the invention describes a three wafer edge lift pin system for supporting a wafer positioned in a process chamber of a processing system. Each wafer edge lift pin's lateral position can easily be adjusted with respect to the wafer and a chuck assembly, and position adjustments can be made in the process chamber after all other assembly work is complete. The wafer edge lift pin system can retain the wafer regardless of its position with respect to the wafer alignment notch at the edge of the wafer. The adjustable edge lift pin system can be readily fabricated using common machining processes.

FIG. 1A shows an elevated side view of a wafer edge lift pin 10 according to an embodiment of the invention. In one example, the wafer edge lift pin 10 may be manufactured from polyether ether ketone (PEEK™) plastic. The wafer edge lift pin 10 has a top section 17, a round base section 16, and a round bottom section 15. The top section 17 has a notch portion 12 with a horizontal upwardly facing surface 11 for supporting a wafer (not shown) and a vertically sloped surface 14 for lateral confinement of the wafer. The intersection of the vertically sloped surface 14 and the horizontal upwardly facing surface 11 has an angle that is greater than 90 degrees. The notch portion 12 is horizontally swept away from the wafer along a large radius. The swept profile 31 (see FIGS. 5A and 5B) of the notch portion 12 allows the wafer edge lift pin 10 to increase or decrease the wafer confinement window as the wafer edge lift pin 10 is rotated horizontally about its base section 16. Furthermore, the swept profile 31 of the notch portion 12 has a large enough radius to prevent a wafer alignment notch 38 (see FIGS. 5A and 5B) at the edge of the wafer from seating around the notch's slope.

FIG. 1B shows another elevated side view of a portion of the wafer edge lift pin 10 according to an embodiment of the invention. The base section 16 below the top section 17 has a diameter 32 that is greater than a diameter 34 of the top section 17 across the notch portion 12. Further, the bottom section 15 has a diameter 36 that is smaller than the diameter 32 of the base section 16. In one embodiment, a vertical centerline 17a of the top section 17 and the base section 16 are not aligned with a vertical centerline 15a of the bottom section 15, but separated by an offset 19. In one example, the offset 19 can be between about 0.020 inches and about 0.025 inches. However, in other examples the offset 19 may be greater than about 0.025 inches or less than about 0.020 inches. According to one embodiment, the vertical centerline 17a of the top section 17 and the base section 16, and the vertical centerline 15a of the bottom section 15 may be aligned and the offset 19 therefore zero.

The diameter 32 of the base section 16 is larger than the diameter 34 the top section 17 across the notch portion 12 in order to increase stiffness of the wafer edge lift pin 10 and help ensure that the wafer edge lift pin 10 is square/perpendicular when mounted to a lift plate 20 shown in FIG. 2. The wafer edge lift pin 10 is mounted in a circular recessed feature (not shown) on the lift plate 20 using a close-fit bottom section 15 (e.g., a boss feature) beneath the base section 16. A screw (not shown) may be used to secure the bottom section 15 of the wafer edge lift pin 10 to the lift plate 20. Referring back to FIG. 1A, a small vent hole 13 is drilled through the sidewall 21 of wafer edge lift pin 10 at the end of a tapped hole (not shown) in the bottom section 15, the base section 16, and the top section 17, in order to prevent virtual leaks in a vacuum environment in the process chamber. The base section 16 also has wrench flats 18 that allow the wafer edge lift pin 10 to be easily rotated on the lift plate 20. The wrench flats 18 accommodate adjustment of the lateral wafer containment window while installed in intended equipment, such as in a process chamber. The adjustment can be completed to compensate for varying operating temperatures, wafer diameters, and manufacturing and assembly tolerances. The presence of the offset 19 allows for increased adjustment of the lateral wafer containment window as the wafer edge lift pin 10 is rotated on the lift plate 20. A centering portion 22 of the lift plate 20 may be used for aligning a center of the lift plate 20 with a center of the chuck assembly 40 described below in FIG. 4.

Figure 3:
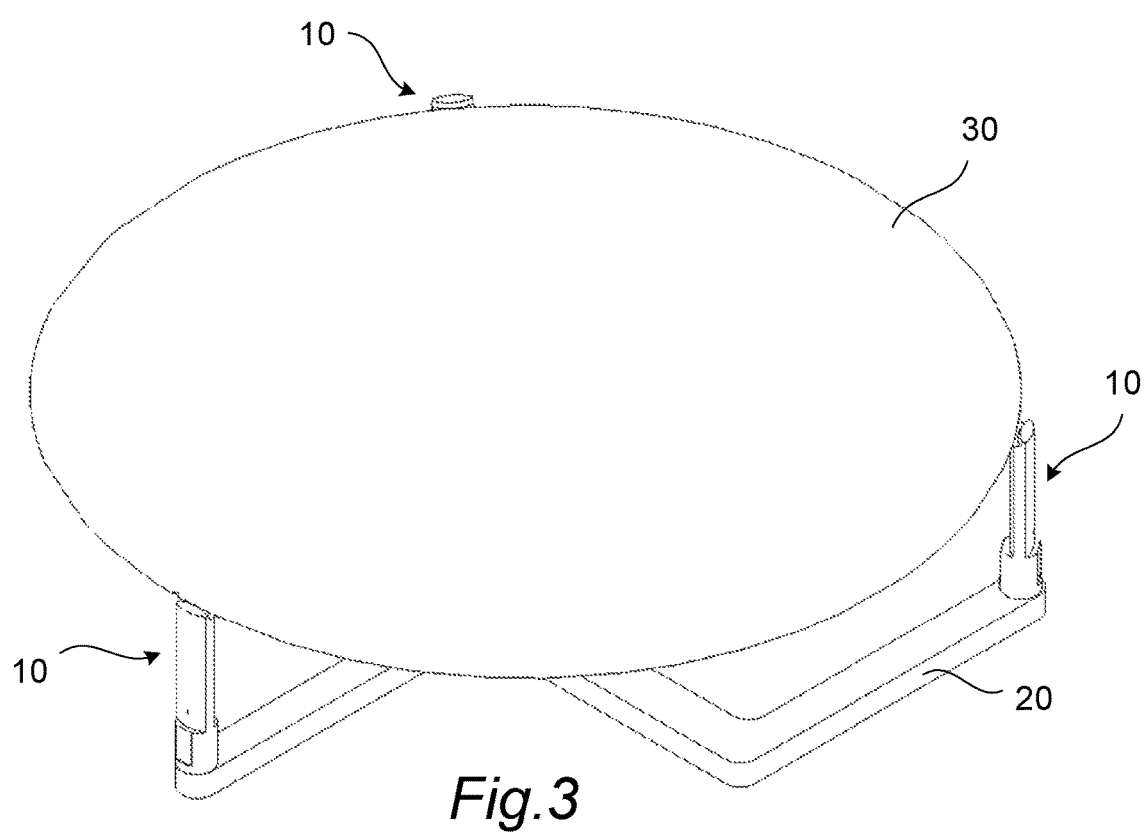
FIG. 3 shows a lift plate and a wafer supported by wafer edge lift pins according to an embodiment of the invention.

FIG. 3 shows a lift plate 20 and a wafer 30 supported by three wafer edge lift pins 10 according to an embodiment of the invention. The wafer 30 can be a thin slice of semiconductor material, such as crystalline silicon, that is used in electronics for the fabrication of integrated circuits and in photovoltaics for conventional, wafer-based solar cells. The wafer 30 can serve as the substrate for microelectronic devices built in and over the wafer 30 and the wafer 30 undergoes many microfabrication process steps such as doping or ion implantation, etching, deposition of various materials, and photolithographic patterning. In some examples, the wafer 30 may have a diameter of 100 mm, 200 mm, 300 mm, or 450 mm.

According to an embodiment of the invention, an apparatus for manufacturing a semiconductor device using a wafer is provided. The apparatus includes a process chamber where the wafer is processed, a chuck assembly on which the wafer is loaded, and a plurality of at least three wafer edge lift pins for moving the wafer up and down.

Figure 4:
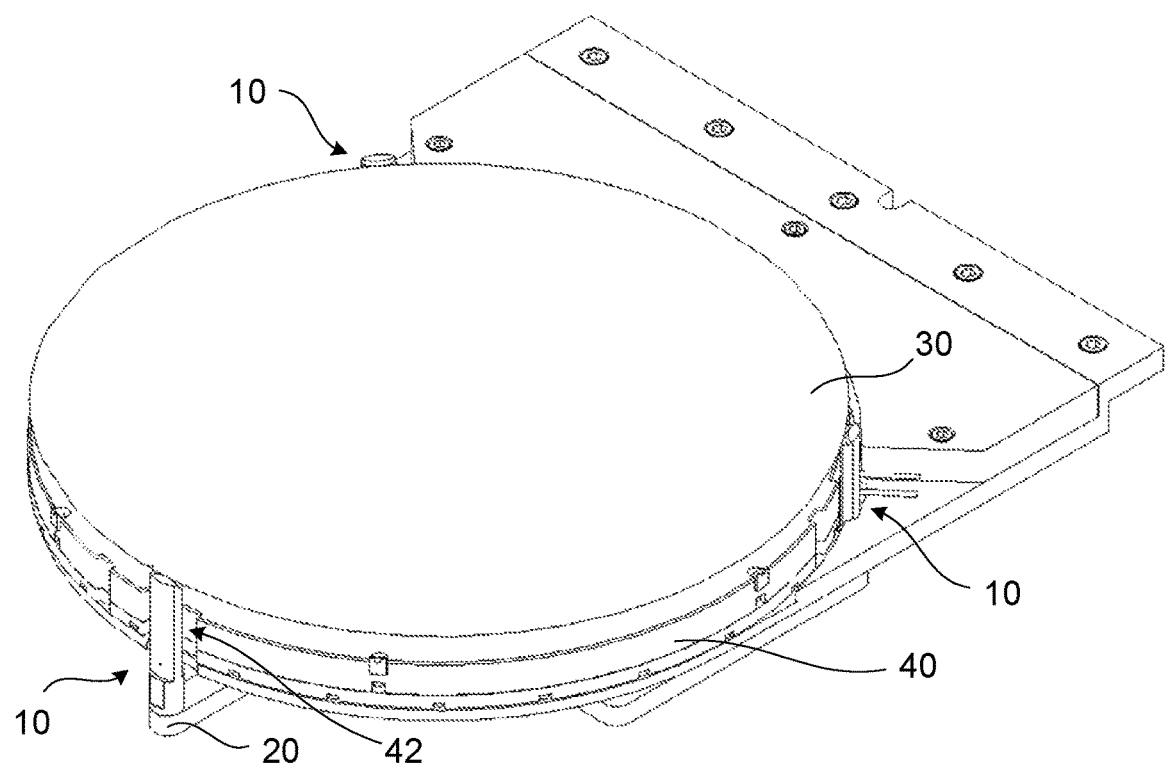
FIG. 4 shows a chuck assembly, a lift plate, and a wafer raised above the chuck assembly by wafer edge lift pins according to an embodiment of the invention.

FIG. 4 shows a chuck assembly 40, a lift plate 20, and a wafer 30 raised above the chuck assembly 40 by three wafer edge lift pins 10 according to an embodiment of the invention. During assembly, the wafer edge lift pin 10 may be connected to the lift plate 20 while outside of the process chamber. The rotational position of each wafer edge lift pin 10 can be made approximate and only good enough to ensure that they pass through a clearance slots 42 on the outer edge of the chuck assembly 40. Once the lift plate 20 and the chuck assembly 40 are installed, the wafer edge lift pins 10 may be raised to the lifted/transfer position. At this point the wafer edge lift pins 10 may be rotated to achieve the desired clearance between the wafer edge lift pins 10 and the chuck assembly 40. The clearance may be measured using feeler gauges.

Still referring to FIG. 4, the wafer 30 may be raised/lowered from the chuck assembly 40 using the lift plate 20 containing the three wafer edge lift pins 10 that contact the underside of the edge of the wafer 30 and laterally confine the wafer 30. A wafer end effector or robot arm (not shown) that contacts the underside of the wafer 30 may be used to bring the wafer 30 into a process chamber and position the wafer 30 onto the three wafer edge lift pins 10. Thereafter, the wafer end effector may be lowered and withdrawn from the process chamber as the wafer 30 is supported by the three wafer edge lift pins 10. Then the three wafer edge lift pins 10 may be used to lower the wafer 30 onto the chuck assembly 40. Furthermore, after processing the wafer 30, the wafer end effector may be used to remove the wafer 30 once the wafer 30 is raised from the chuck assembly 40 using the three wafer edge lift pins 10.

Figures 5A, 5B:
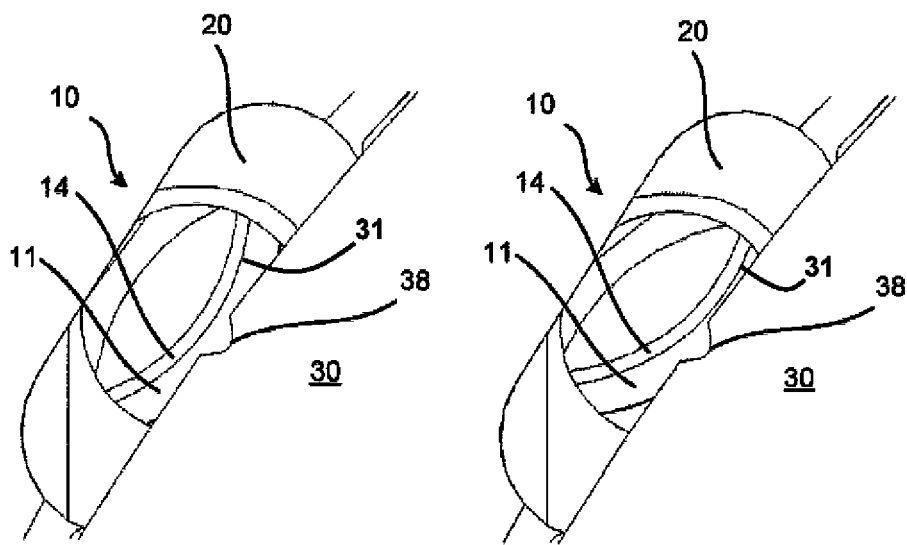
FIGS. 5A and 5B show top views of a wafer supported by a wafer edge lift pin.

FIGS. 5A and 5B show top views of a wafer 30 supported by a wafer edge lift pin 10. The design of the wafer edge lift pin 10 enables vertical wafer support while maintaining consistent lateral containment clearances. As seen by the wafer edge lift pin 10 in FIG. 5A and the rotated wafer edge lift pin 10 in FIG. 5B, an active grip that can disturb wafer edge contamination is not used by this design. The adjustable design maintains a consistent lateral containment window without compromising the vertical support zone (i.e., the wafer 30 will not fall off the wafer edge lift pin 10 if justified to one direction). The adjustable design also functions regardless of the alignment of the wafer alignment notch 38 of the wafer 30 since the swept profile 31 of the notch portion 12 is larger than the wafer alignment notch 38. The swept profile 31 of the notch portion 12 is of large enough radius to prevent the wafer alignment notch 38 from seating around the slope of the notch portion 12. For comparison, some other wafer edge support pins designs utilize three pairs of lift pins to accommodate the position of the wafer alignment notch.

A wafer edge lift pin design for supporting wafers used to manufacture microelectronic devices have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A wafer edge lift pin of an apparatus for manufacturing a semiconductor device, the wafer edge lift pin comprising:
   a top section containing a notch portion having a horizontal upwardly facing surface for supporting a wafer and a vertically sloped surface for lateral confinement of the wafer, wherein the notch portion is horizontally swept away from the wafer along a radius, and wherein the top section has a vertical centerline;
   a base section below the top section, the base section having a diameter that is greater than a diameter of the top section across the notch portion, wherein the base section has a vertical centerline; and
   a bottom section having a diameter that is smaller than the diameter of the base section, wherein the bottom section has a vertical centerline, and wherein the vertical centerlines of the top section and the base section are horizontally offset from the vertical centerline of the bottom section such that rotation of the lift pin allows adjustment of the lateral confinement provided by the vertically sloped surface for the wafer as the lift pin is rotated.

2. The wafer edge lift pin of claim 1, wherein the vertical centerline of the base section and the vertical centerline of the bottom section are horizontally offset between about 0.020 inches and about 0.025 inches.

3. The wafer edge lift pin of claim 1, wherein a swept profile of the notch portion on the top section of the lift pin prevents a wafer alignment notch on the wafer from seating around the notch portion.

4. The wafer edge lift pin of claim 1, wherein an intersection of the vertically sloped surface and the horizontally upwardly facing surface has an angle of greater than 90 degrees.

5. The wafer edge lift pin of claim 1, wherein the radius is large enough to prevent a wafer alignment notch on the wafer from seating around the vertically sloped surface of the notch portion.

6. A wafer edge lift pin of an apparatus for manufacturing a semiconductor device, the wafer edge lift pin comprising:
   a top section containing a notch portion having a horizontal upwardly facing surface for supporting a wafer and a vertically sloped surface for lateral confinement of the wafer, wherein the notch portion is horizontally swept away from the wafer along a radius, wherein an intersection of the vertically sloped surface and the horizontally upwardly facing surface has an angle of greater than 90 degrees, wherein a swept profile of the notch portion prevents a wafer alignment notch on the wafer from seating around the notch portion, and wherein the top section has a vertical centerline;
   a base section below the top section, the base section having a diameter that is greater than a diameter of the top section across the notch portion, wherein the base section has a vertical center line; and
   a bottom section having a diameter that is smaller than the diameter of the base section, wherein the vertical centerlines of the base section and the top section are horizontally offset from the vertical centerline of the bottom section such that rotation of the lift pin allows adjustment of the lateral confinement provided by the vertically sloped surface for the wafer as the lift pin is rotated.

7. The wafer edge lift pin of claim 6, wherein the vertical centerline of the base section and a vertical centerline of the bottom section are horizontally offset between about 0.020 inches and about 0.025 inches.

8. The wafer edge lift pin of claim 6, wherein the radius is large enough to prevent a wafer alignment notch on the wafer from seating around the vertically sloped surface of the notch portion.

9. An apparatus for manufacturing a semiconductor device using a wafer, the apparatus comprising:
   a process chamber where the wafer is processed;
   a chuck assembly in the process chamber on which the wafer is loaded; and
   a plurality of at least three wafer edge lift pins for moving the wafer up and down, each of the plurality of at least three wafer edge lift pins comprising:
   a top section containing a notch portion having a horizontal upwardly facing surface for supporting a wafer and a vertically sloped surface for lateral confinement of the wafer, wherein the notch portion is horizontally swept away from the wafer along a radius, and wherein the top section has a vertical centerline;
   a base section below the top section, the base section having a diameter that is greater than a diameter of the top section across the notch portion, wherein the base section has a vertical centerline; and
   a bottom section having a horizontal diameter that is smaller than the diameter of the base section, wherein the bottom section has a vertical centerline, and wherein the vertical centerlines of the top section and the base section are horizontally offset from the vertical centerline of the bottom section such that rotation of the lift pin allows adjustment of the lateral confinement provided by the vertically sloped surface for the wafer as the lift pin is rotated.

10. The apparatus of claim 9, further comprising a lift plate that supports the plurality of at least three wafer edge lift pins.

11. The apparatus of claim 9, wherein the lift plate includes a centering portion for aligning a center of the lift plate with a center of the chuck assembly.

12. The apparatus of claim 9, wherein an outer edge the chuck assembly includes clearance slots through which the plurality of at least three wafer edge lift pins pass when moving the wafer up and down.

13. The apparatus of claim 9, wherein the vertical centerline of the base section and the vertical centerline of the bottom section are horizontally offset between about 0.020 inches and about 0.025 inches.

14. The apparatus of claim 9, wherein a swept profile of the notch portion on the top section prevents a wafer alignment notch from seating around the notch portion.

15. The apparatus of claim 9, wherein an intersection of the vertically sloped surface and the horizontally upwardly facing surface has an angle of greater than 90 degrees.

16. The apparatus of claim 9, wherein the radius is large enough to prevent a wafer alignment notch on the wafer from seating around the vertically sloped surface of the notch portion.

* * * * *